United States Patent
Alfano et al.

(10) Patent No.: US 7,119,359 B2
(45) Date of Patent: Oct. 10, 2006

(54) PHOTODETECTORS AND OPTICALLY PUMPED EMITTERS BASED ON III-NITRIDE MULTIPLE-QUANTUM-WELL STRUCTURES

(75) Inventors: Robert R. Alfano, Bronx, NY (US); Shengkun Zhang, Ridgewood, NY (US); Wubao Wang, Flushing, NY (US)

(73) Assignee: Research Foundation of the City University of New York, NY (US)

(*) Notice: Subject to any disclaimer, the term of this patent is extended or adjusted under 35 U.S.C. 154(b) by 0 days.

(21) Appl. No.: 10/728,562

(22) Filed: Dec. 5, 2003

(65) Prior Publication Data

US 2004/0135222 A1 Jul. 15, 2004

Related U.S. Application Data

(60) Provisional application No. 60/430,971, filed on Dec. 5, 2002.

(51) Int. Cl.
   *H01L 33/00* (2006.01)
   *H01L 29/205* (2006.01)
   *H01L 31/0304* (2006.01)
(52) U.S. Cl. .............. 257/25; 257/13; 257/21; 257/97
(58) Field of Classification Search .......... 257/25, 257/97
   See application file for complete search history.

(56) References Cited

U.S. PATENT DOCUMENTS

| 6,614,060 B1* | 9/2003 | Wang et al. | 257/103 |
| 6,649,943 B1 | 11/2003 | Shibata et al. | |
| 2002/0096675 A1* | 7/2002 | Cho et al. | 257/25 |
| 2002/0175324 A1* | 11/2002 | Razeghi | 257/14 |
| 2003/0176003 A1* | 9/2003 | Schaff et al. | 438/47 |

OTHER PUBLICATIONS

Raisky et al, Applied Physics Letters, vol. 79 No. 3, Jul. 16, 2001, "Carrier screening . . . structures" pp. 430-432.*

* cited by examiner

*Primary Examiner*—Jerome Jackson
(74) *Attorney, Agent, or Firm*—Cohen, Pontani, Lieberman & Pavane (57) ABSTRACT

The design and operation of a p-i-n device, operating in a sequential resonant tunneling condition for use as a photodetector and an optically pumped emitter, is disclosed. The device contains III-nitride multiple-quantum-well (MQW) layers grown between a III-nitride p-n junction. Transparent ohmic contacts are made on both p and n sides. The device operates under a certain electrical bias that makes the energy level of the first excitation state in each well layer correspond with the energy level of the ground state in the adjoining well layer. The device works as a high-efficiency and high-speed photodetector with photo-generated carriers transported through the active MQW region by sequential resonant tunneling. In a sequential resonant tunneling condition, the device also works as an optically pumped infrared emitter that emits infrared photons with energy equal to the energy difference between the first excitation state and the ground state in the MQWs.

6 Claims, 8 Drawing Sheets

PHOTODETECTORS AND OPTICALLY PUMPED EMITTERS BASED ON III-NITRIDE MULTIPLE-QUANTUM-WELL STRUCTURES

RELATED APPLICATIONS

This application claims priority from U.S. Provisional Patent Application Ser. No. 60/430,971 which was filed on Dec. 5, 2002.

BACKGROUND OF THE INVENTION

1. Field of the Invention

This invention relates to sequential resonant tunneling (SRT) photodetector and emitter devices based on III-nitride multiple-quantum-well (MQW) structures; to methods of their fabrication; and to methods of their use, where III-nitride refers to compound alloys of nitride and group III elements including aluminum, gallium, and indium.

2. Description of the Related Art

III-nitride-based photodetectors are used in space-to-earth and space-to-space communication, missile plume detection, detection of biological organisms and bacteria, combustion sensing and control for aircraft engines, optical storage, air quality monitoring, cancer diagnosis, and personal ultraviolet exposure dosimetry. Alloys of III-nitride are becoming the semiconductor of choice for photodetectors and light emitters in the wavelength range from yellow to ultraviolet due to their direct and wide band gaps. Because of their thermal stability and radiation hardness, these materials are remarkably tolerant in aggressive environments. By designing the semiconductors to have different mole fractions of group III elements in the nitride compounds, the cutoff wavelength of III-nitride-based detectors is adjustable in a wide wavelength range from 630 nm to 200 nm. This approach makes selective spectral detection realizable. As the result of the rapid progress of growth techniques, such as metal organic chemical vapor deposition (MOCVD) and molecular beam epitaxy (MBE), ultraviolet photodetectors based on GaN bulk material have even been commercialized. However, quantum efficiency and response speed of bulk-based photodetectors are limited by their low absorption efficiency and low carrier mobilities.

U.S. Pat. No. 6,649,943 to Shibata et al, for "Group III Nitride Compound Semiconductor Light Emitting Element", discloses a group III nitride compound semiconductor light-emitting element formed of group III nitride semiconductor layers, including a multi-layer containing light-emitting layers; a p-type semiconductor layer; and an n-type semiconductor layer, wherein the multi-layer includes a multiple quantum barrier-well layer containing quantum-barrier-formation barrier layers formed from a group III nitride semiconductor and quantum-barrier well layers formed from a group III nitride compound semiconductor, the barrier layers and the well layers being laminated alternately and cyclically, and a plurality of low-energy-band-gap layers which emit light of different wavelengths, with the multiple quantum barrier well layer being provided between the low-energy-band-gap layers.

The devices of Shibata et al are electrically pumped light emitters, which are used as UV and visible light sources. The active layers of these devices are the low-energy-band-gap layers adjacent to the multiple quantum barrier-well layer. The devices operate under a forward bias that creates carrier injection to the low-energy-band-gap layers. The injected carriers recombine in the low-energy-band-gap layers and generate UV and visible light. These devices use inter-band carrier recombination in the low-energy-band-gap layers. Electrons from the n-type layer and holes from the p-type layer are injected to the low-energy-band-gap layers and recombine there to produce UV and visible light. These devices do not rely on the phenomenon of sequential resonant tunneling. The measurable output signal of these devices is the optical power of the emitted light. The quantum efficiency of these devices is evaluated by the fraction of injected electrons and holes that recombine in the low-energy band-gap layers and successfully generate UV and visible photons.

SUMMARY OF THE INVENTION

The various features of novelty which characterize the invention are pointed out with particularity in the claims annexed to and forming a part of the disclosure. For a better understanding of the invention, its operating advantages, and specific objects attained by its use, reference should be had to the drawing and descriptive matter in which there are illustrated and described preferred embodiments of the invention.

We have discovered that by taking advantage of sequential resonant tunneling of carriers in multiple quantum wells, we have been able to design III-nitride photodetectors and optically pumped emitters based on multiple-quantum-well structures. The devices of the present invention contain semi-insulate MQW layers sandwiched between a p-n junction. A device according to the present invention is also an optically pumped infrared emitter, capable of outputting infrared light that emits from relaxation of photogenerated carriers. We have also recognized and taken into consideration certain important effects induced by the large spontaneous piezoelectric polarization that occurs in III-nitride heterojunctions.

In contrast to the related art, the devices of the present invention are used predominantly for the detection of external light signals or infrared light sources, not as light sources themselves. The devices of the present invention are not used to emit light in the visible or ultraviolet (UV) spectrum, but can be used as emitters of photons in the infrared (IR) spectrum. The structure of the devices of the present invention includes a p-type semiconductor layer, an n-type semiconductor layer, and a multiple quantum barrier-well layer. Structures of the devices of the present invention do not contain low-energy-band-gap layers. The active layer of the devices of the present invention is a multiple quantum barrier-well layer. Devices of the present invention operate under a reversed bias without carrier injection; and require external light excitation to generate photovoltaic signals in the multiple quantum barrier-well layer. Devices of the present invention utilize a photovoltaic effect that produces photovoltaic signals and infrared light as a by-product. External light generates electrons and holes in the multiple quantum barrier-well layer of the devices of the present invention. The photo-excited electrons are transported to the n-type semiconductor layer, while the photo-excited holes are transported to the p-type semiconductor layer in the devices of the present invention. In the devices of the present invention, electrons are transported through the multiple quantum barrier-well layer by sequential resonant tunneling. The measurable output signal of the devices of the present invention is a photocurrent and a photovoltage. The quantum efficiency of devices of the present invention is evaluated by the fraction of incident photons that generate carriers in the multiple quantum barrier-well layer, which are successfully transported to the n-type semiconductor layer and the p-type semiconductor layer.

Accordingly, we have designed devices according to the present invention which demonstrate the following non-limiting advantages over devices of the related art:

i) Carrier transport efficiency is significantly increased because of both reduced non-radiative and radiative carrier recombination that occurs in the sequential resonant tunneling condition;

ii) Response speed of the device is greatly increased since photogenerated carriers are transported by sequential resonant tunneling;

iii) Both short and long cutoff wavelengths are adjustable by setting different structure parameters;

iv) Thermal noise is decreased due to quantum confinement of carriers in the MQW region;

v) Quantum efficiency is greatly increased because of high optical absorption in quantum wells comparing to bulk materials.

Photodetectors and emitters according to the present invention are based on III-nitride multiple quantum wells. The devices have a p-n junction with III-nitride MQW layers sandwiched between p type semiconductor and n type semiconductor III-nitride layers. Ohmic contacts are provided for the surfaces of both p type and n type semiconductor layers. Structure parameters of the device are adjustable to achieve desired features of the photodetector. The photodetector operates in a certain biased condition where photogenerated carriers are transported through the MQW layers by sequential resonant tunneling. The device can also operate as an optically pumped infrared emitter which amplifies input optical signal by a factor of M, where M is equal to or smaller than the number of the quantum wells. These devices have high transport efficiency, high absorption efficiency, high quantum efficiency and high response speed. Devices according to the present invention incorporate undoped or lightly doped III-nitride MQW layers embedded in p-type and n-type III-nitride semiconductor layers. By introducing these multiple quantum well layers as an active region, the performance of photodetectors and emitters is greatly improved. Ohmic contacts are made to the front and back surfaces of the p and n semiconductor layers. The mole fractions of group III elements in the nitride compounds used in the device are adjustable from 0 to 1 according to desired wavelength cutoffs of from 630 nm (InN) to 200 nm (AlN). The device operates in an electrically biased condition, where sequential resonant tunneling of photogenerated carriers occurs in the MQW region. In this condition, both radiative and non-radiative carrier recombination are effectively decreased and high efficient photon detection and emission is obtained.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

In the drawings.

DETAILED DESCRIPTION OF THE PRESENTLY PREFERRED EMBODIMENTS

All materials of III-nitride compound semiconductors are utilizable in the design of photodetectors and emitters according to the present invention. AlGaN alloys are used in the following examples as being representative.

Layered Semiconductor Structure of a Photodetector

Figure 1:
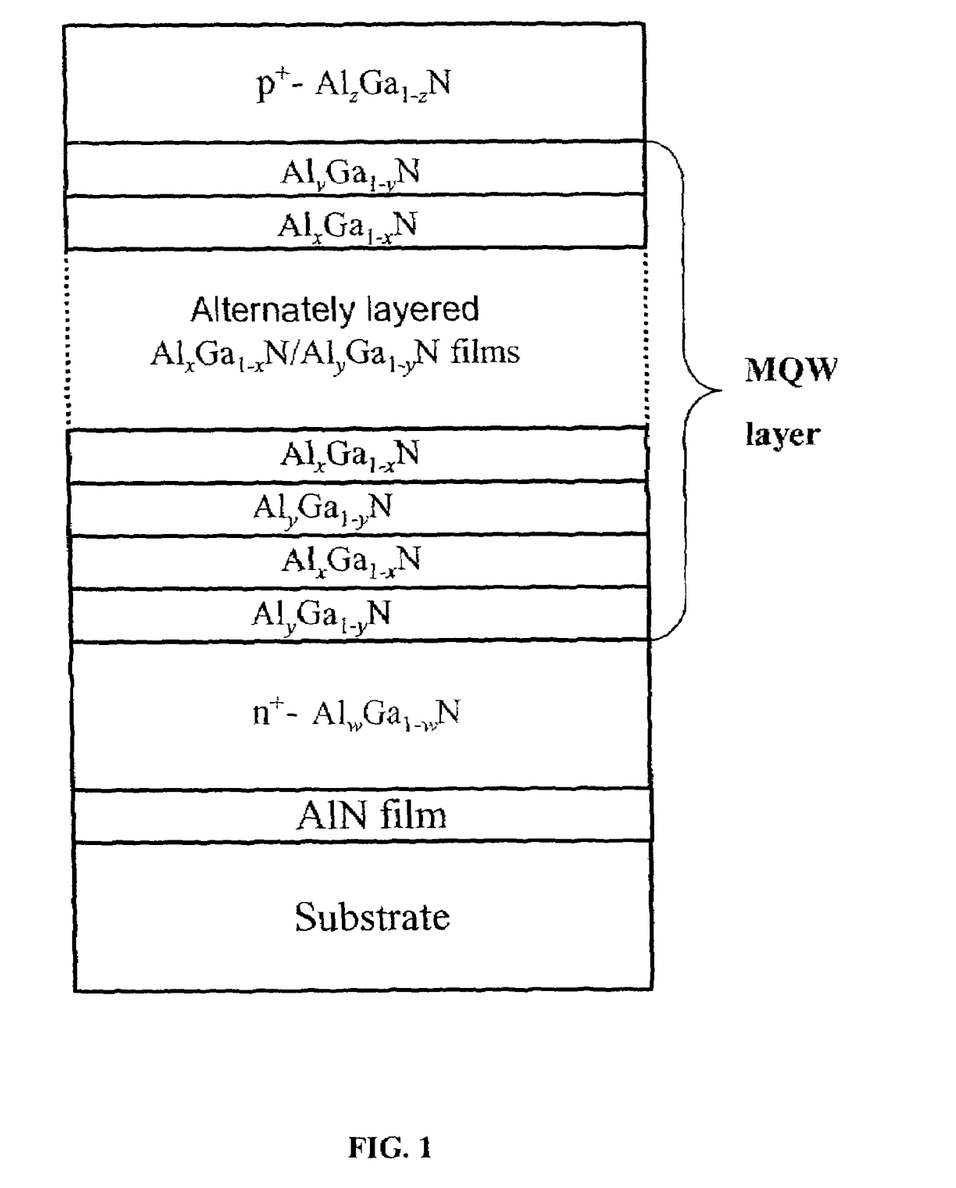
FIG. 1 is a schematic of a layered semiconductor structure according to the present invention, based on AlGaN materials with AlGaN quantum wells embedded in a AlGaN p-n junction, for use as a photodetector.

Referring to FIG. 1, a layered semiconductor structure of a photodetector based on $Al_xGa_{1-x}N/Al_yGa_{1-y}N$ (x<y) MQWs according to the present invention is shown, where x and y are aluminum mole fraction in $Al_xGa_{1-x}N$ and $Al_yGa_{1-y}N$ layers, respectively. x and y are in the range from 0 to 1. From bottom to top, the semiconductor structure consists of a substrate crystal, a AlN semiconductor nucleation layer, heavily doped n type $Al_wGa_{1-w}N$ material, alternately layered $Al_xGa_{1-x}N$ and $Al_yGa_{1-y}N$ layers, and heavily doped p type $Al_zGa_{1-z}N$ material. The substrate is selected to be lattice-matched material to III-nitride. In the case of the device of FIG. 1, for example, bulk AlGaN materials, zinc oxide (ZnO), sapphire ($Al_2O_3$) and silicon carbide (SiC) are proper candidates. The thicknesses and the mole fractions of group III elements for different semiconductor layers vary depending on desired features of designed photodetectors.

Structure Parameters

Structure parameters, such as mole fractions of group III elements in alloyed layers, and thickness and dopant concentration of different layers, are chosen to meet desired requirements of the photodetector and emitters, e.g., desired band detection, infrared emission wavelength, and operation bias. The photodetector is designed to create a photocurrent in short-circuit mode and a photovoltage in open-circuit mode in a wavelength range from a short cutoff wavelength to a long cutoff wavelength. In the emitter mode, the device is designed to emit infrared photons pumped by incident light.

The Al mole fraction of the aluminum-containing group III nitride compound of either the p semiconductor layer or the n semiconductor layer of the window layer is specified so as to make the band gap of the semiconductor larger than the energy difference between the ground states of heavy holes and electrons in the MQW region, since the window layer must be transparent to desired photoresponse wavelengths. The window layer is responsible for the short cutoff wavelength and should be thick enough to absorb incident light with wavelength shorter than the desired short cutoff wavelength. The thickness of the window layer is typically on the order of one micrometer. The window layer must be heavily doped to achieve a carrier concentration that is not limited, but typically is on the order of $10^{18}$ $cm^{-3}$ or higher.

The MQW layers are active layers which create detectable photovoltaic signals (either photocurrent or photovoltage) in the desired wavelength range. The Al mole fractions x and y are adjustable from 0 to 1 to achieve the desired features. The number of the MQW layers varies from several to hundred, and should be sufficient so as to cause the incident light to be completely absorbed by the MQW layers. The thickness of one single layer is on the order of nanometers. The $Al_xGa_{1-x}N$ layers are all of the same thickness and act as quantum wells. The $Al_yGa_{1-y}N$ layers, which have a higher Al fraction, also all have the same thickness, which may or may not be the same as the thickness of the layers which act as the wells, and act as quantum barriers. The long cutoff wavelength is attributed to the optical absorption of heavy hole to electron transition in the $Al_xGa_{1-x}N$ quantum wells. In order to achieve a state of sequential resonant tunneling of electrons, there should exist at least two eigenstates, ground state and the first excited state, which are separated by an energy difference much greater than the kinetic energy of carriers. The energy positions of the two eigenstates are determined by the thicknesses and the Al mole fractions of the wells and the barriers in the MQW region. Theoretical values of their energy positions are obtained by numerically solving for different MQW parameters the effective mass equation, $$\left[-\frac{\hbar^2}{2m^*}\nabla^2 + V(z)\right]F(z) = E_n F(z),$$

where $\hbar$ is the reduced Planck constant, $m^*$ is the electron effective mass, $V(z)$ is the electron potential along the material growth direction, $F(z)$ is the effective-mass envelope function of electrons, and $E_n$ is the energy of electrons at the nth energy level in the quantum wells.

Figure 2:
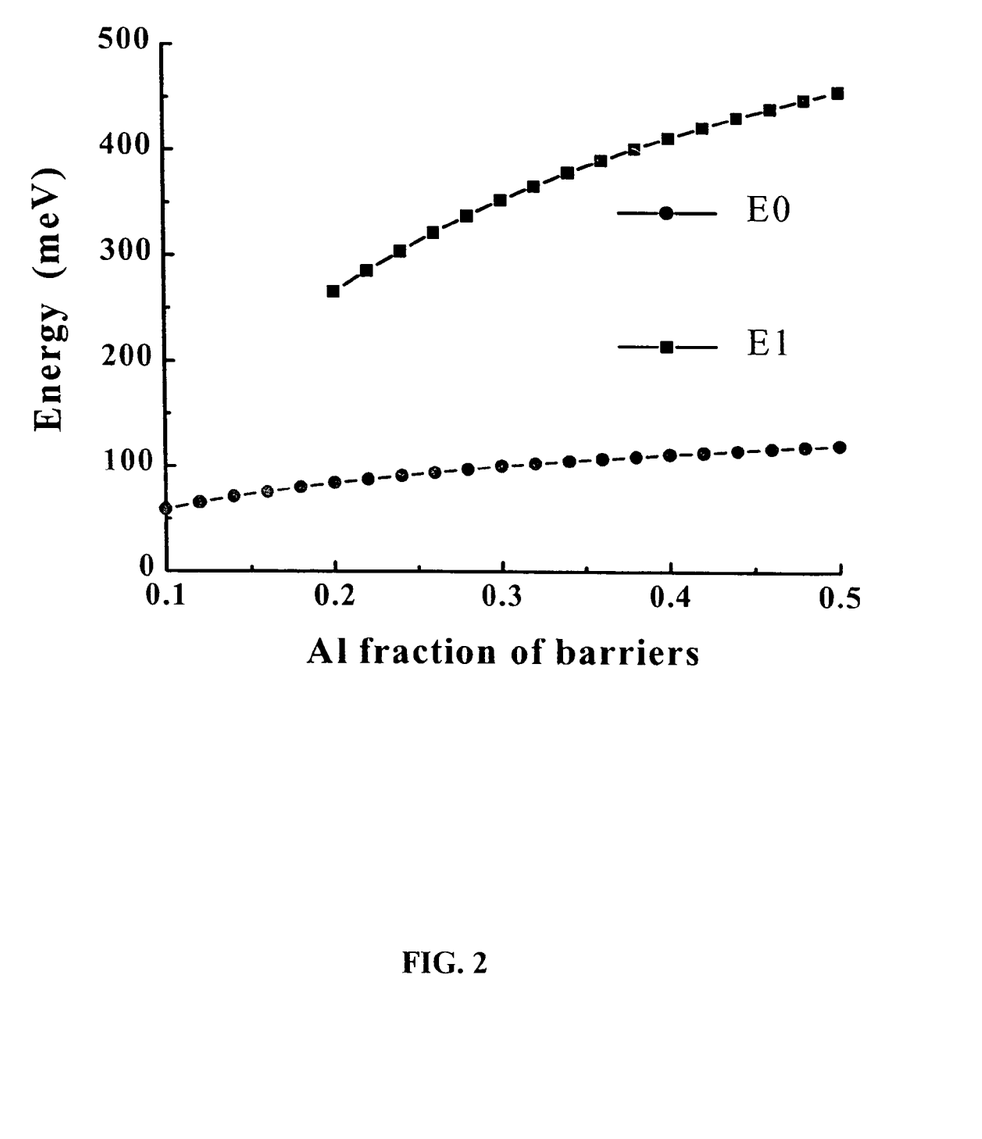
FIG. 2 is a graph of confinement energies of the ground state E0 and the first excited state E1, as a function of Al mole fraction of AlGaN barriers, for a layered semiconductor structure according to the present invention, having GaN/AlGaN multiple quantum wells, at a well width of 4 nm.

As a reference, FIG. 2 presents the calculated energy positions of the ground state and the first excited state of electrons in the conduction band as a function of aluminum mole fraction of barriers for a GaN/AlGaN MQW structure with well thickness of 4 nm. The values on the ordinate scale represent the energy distance from the conduction minimum of GaN. The MQW layers are typically undoped or doped by compensation to make them semi-insulate.

The other p or n layer, except the window layer, is not limited but generally set to have an Al mole fraction equal or lower than that of the quantum well layers ($Al_xGa_{1-x}N$). Its thickness is not limited but is generally set to be a few hundred nanometers. This layer is designed to be heavily doped to achieve a carrier concentration which is not limited, but typically is on the order of $10^{18}$ $cm^{-3}$ or higher.

Device Configuration

Figure 3:
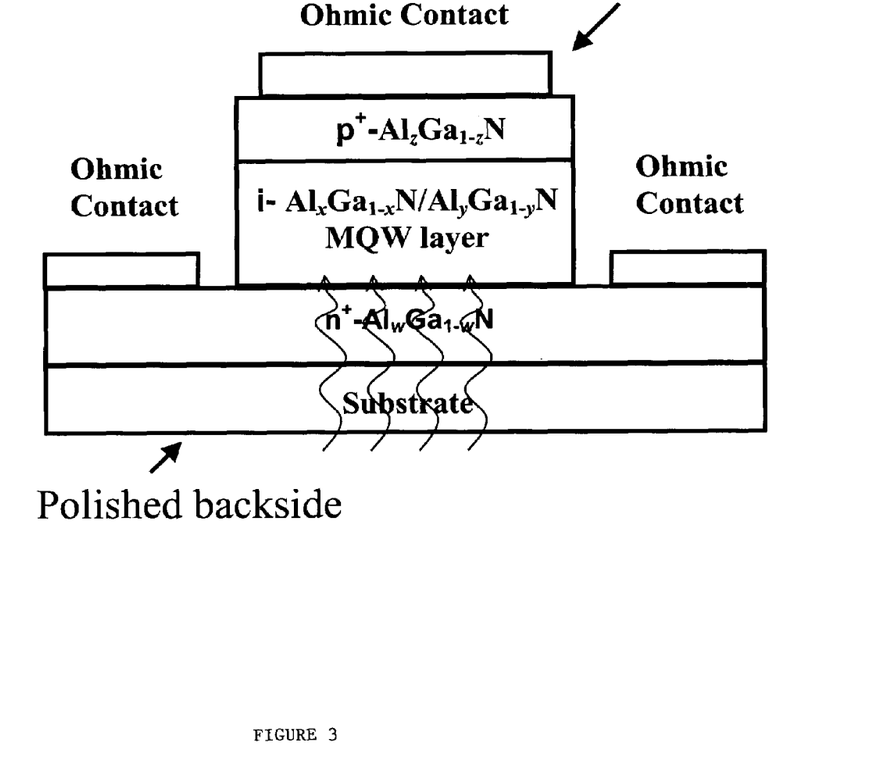
FIG. 3 is a schematic of a device utilizing the semiconductor structure of FIG. 1, configured as a back-illuminated photodetector, and showing the incident direction of light.

The photodetectors and emitters are designed for either front or back side illumination, depending on the position of the window layer. The window layer is set close to the substrate for back-illuminated detection and close to the top surface for front-illuminated detection. Referring to FIG. 3, the device configuration of a back-illuminated photodetector based on the layered structure of FIG. 1 is shown. To fabricate the device, the semiconductor layers are etched down to the surface of the n type $Al_wGa_{1-w}N$ layer and suitable metal alloys are deposited on the etched surfaces to form n-type ohmic contacts. Suitable metal alloys are deposited on the top surfaces of the p type $Al_zGa_{1-z}N$ layer to form transparent p-type ohmic contacts. Any geometry of the metal contacts is acceptable.

Operation Principle

Figure 4:
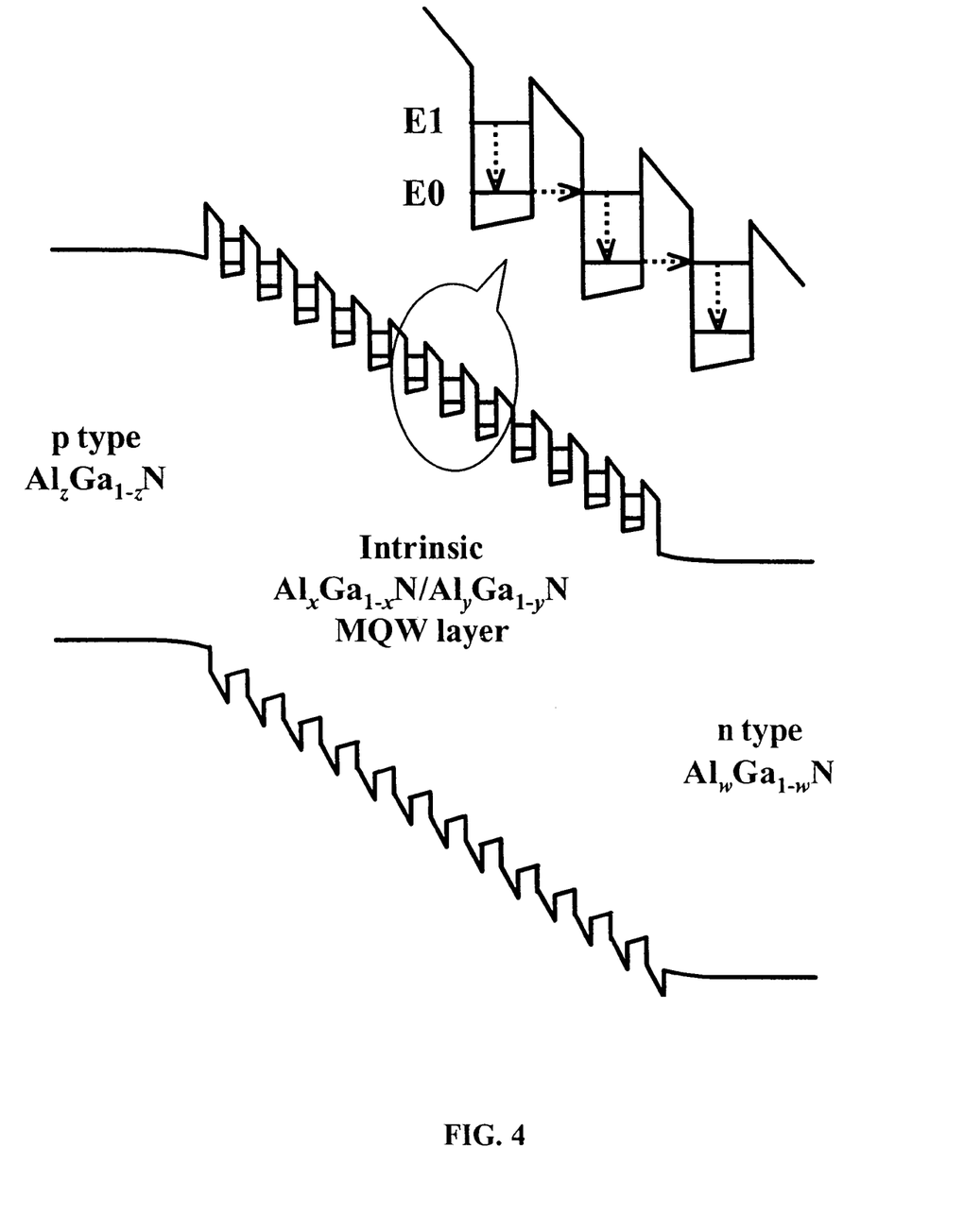
FIG. 4 is a schematic band diagram of the photodetector of FIG. 3, with 12 quantum wells, and under an operation bias where sequential resonant tunneling of electrons occur, with rightward pointing arrows indicating carrier tunneling direction, while downward pointing arrows indicate carrier relaxation from the first excited state to the ground state.

The photodetectors and emitters work under a certain external electrical bias that causes sequential resonant tunneling of photogenerated carriers to occur. Referring to FIG. 4, a schematic band diagram of the semiconductor layers in the working condition for the device of FIG. 3 is shown. The upper and right diagram of FIG. 4 shows the sequential carrier tunneling and relaxation process in the quantum wells. The working bias is a negative bias on the side of the p type semiconductor layer.

Under the action of this operation bias, a constant electric field is created across the MQW region. This electric field, combining together with the built-in electric field in the p-n junction, lifts the energy level of the ground state (E0) of one quantum well up to the energy position of the first excited state (E1) of its neighboring quantum well close to the lower electron potential direction. In this condition, photoexcited electrons in the MQW region are able to tunnel through the barriers sequentially on a time scale of picoseconds. This greatly reduces the amount of carrier recombination and significantly increases carrier transport efficiency, quantum efficiency, and response speed of the photodetector.

The device can also work as an optically pumped infrared emitter. At the same time of sequential resonant tunneling of photogenerated carriers, electrons on the first excited states relax to the ground states and release photons with an energy equal to the energy difference E1–E0. This energy has a magnitude in the range from a few tens meV to hundreds meV depending on designed layered structures. The corresponding wavelength is on the order of micrometer which covers infrared region. Note that one photogenerated electron tunneling through N quantum wells will totally relax N times from E1 to E0 and release M infrared photons, where M≦N by considering both radiative and non-radiative loss of photogenerated carriers. This means under the resonant tunneling condition, one incident photon will create M infrared photons with the energy E1–E0 emitting out from the device. The input optical signal is amplified by a factor of M. These infrared photons can be readily counted by an available infrared photodetector and reflect the number of incident photons by multiplying a factor of 1/M. The energy of the infrared photons is supplied by external electric power.

The photodetector has a designed spectral response from a short cutoff wavelength to a long cutoff wavelength, corresponding to a desired band detection. The short cutoff wavelength is attributed to band-to-band absorption of the $Al_wGa_{1-w}N$ window layer, while the long cutoff wavelength is attributed to heavy hole to electron absorption of the MQW layers. The short cutoff wavelength $\lambda_s$ can be adjusted by setting different values of Al mole fraction w, which is defined by the following equation, $$\lambda_s = 1240/[6.2w + 3.4(1-w) - bw(1-w)] \text{(nm)}, \quad (1)$$

where b is bowing constant, b=1.0±0.3.

The long cutoff wavelength $\lambda_l$ can be adjusted by setting different structure parameters of the MQW layers as discussed above.

Figure 5:
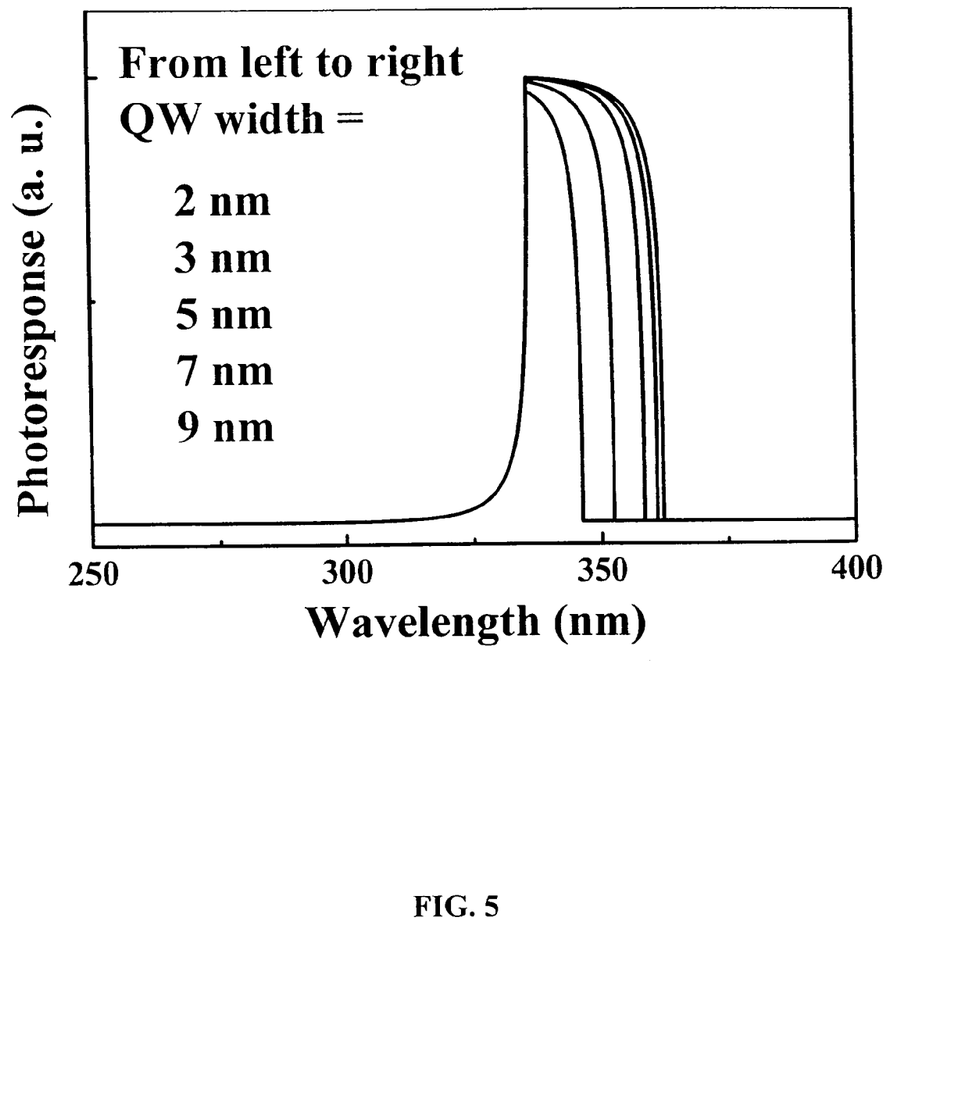
FIG. 5 is a graph of simulated spectral photoresponse curves versus wavelength, established by setting different quantum-well thicknesses for a GaN/Al$_{0.2}$Ga$_{0.8}$N MQW photodetector with a 1 micrometer Al$_{0.15}$Ga$_{0.75}$N window layer.

As a reference, FIG. 5 presents the simulated photoresponse curves by setting different thickness of the quantum-well layers for a $GaN/Al_{0.2}Ga_{0.8}N$ MQW photodetector with a 1 micrometer $Al_{0.15}Ga_{0.75}N$ window layer.

Experimentally, the working bias can be found by measuring current-voltage curves of the photodetector. It is the voltage position where a current peak appears.

Note this operation bias is allowed to be shifted a little due to i) carrier screening effect under high power illumination and ii) temperature change.

Polarization-induced Effects

There exist giant internal fields (up to $10^6$ V/cm) in the quantum wells based on III-nitride materials which are induced by large spontaneous and piezoelectric polarization. These fields dramatically modify optical and electrical properties of III-nitride MQW structures, as well as the performance of the designed photodetector. To maximize the quantum efficiency and the transport efficiency of the photodetector, the growth process should make the orientation of the spontaneous polarization point to the n type layer. In this case, the internal electric fields in the quantum wells point from the p layer to the n layer. Under the working bias, the magnitude of these internal electric fields will be reduced. This will greatly increase absorption efficiency of the MQWs, and at the same time, keep a low dark current level.

Experimentally, the polarity can be selected by using different growth process. For instance, in the AlGaN based structure shown in FIG. 1, during growth process of molecular beam epitaxy, introduction of the thin AlN nucleation layer makes the structure have gallium-face polarity which leads to the spontaneous polarization pointing from the surface to the sapphire substrate in the c-axis (0001) orientation. This will satisfy the design requirement for the polarity.

Other Sample Designs

P and n type semiconductor layers for photodetectors and emitters disclosed in this patent are not limited to be a single III-nitride layer and not limited to be III-nitride materials. For example, p and n type semiconductor layers can be multiple III-nitride layers and other kind of semiconductor materials with lattice matched to III-nitride materials.

Figure 6:
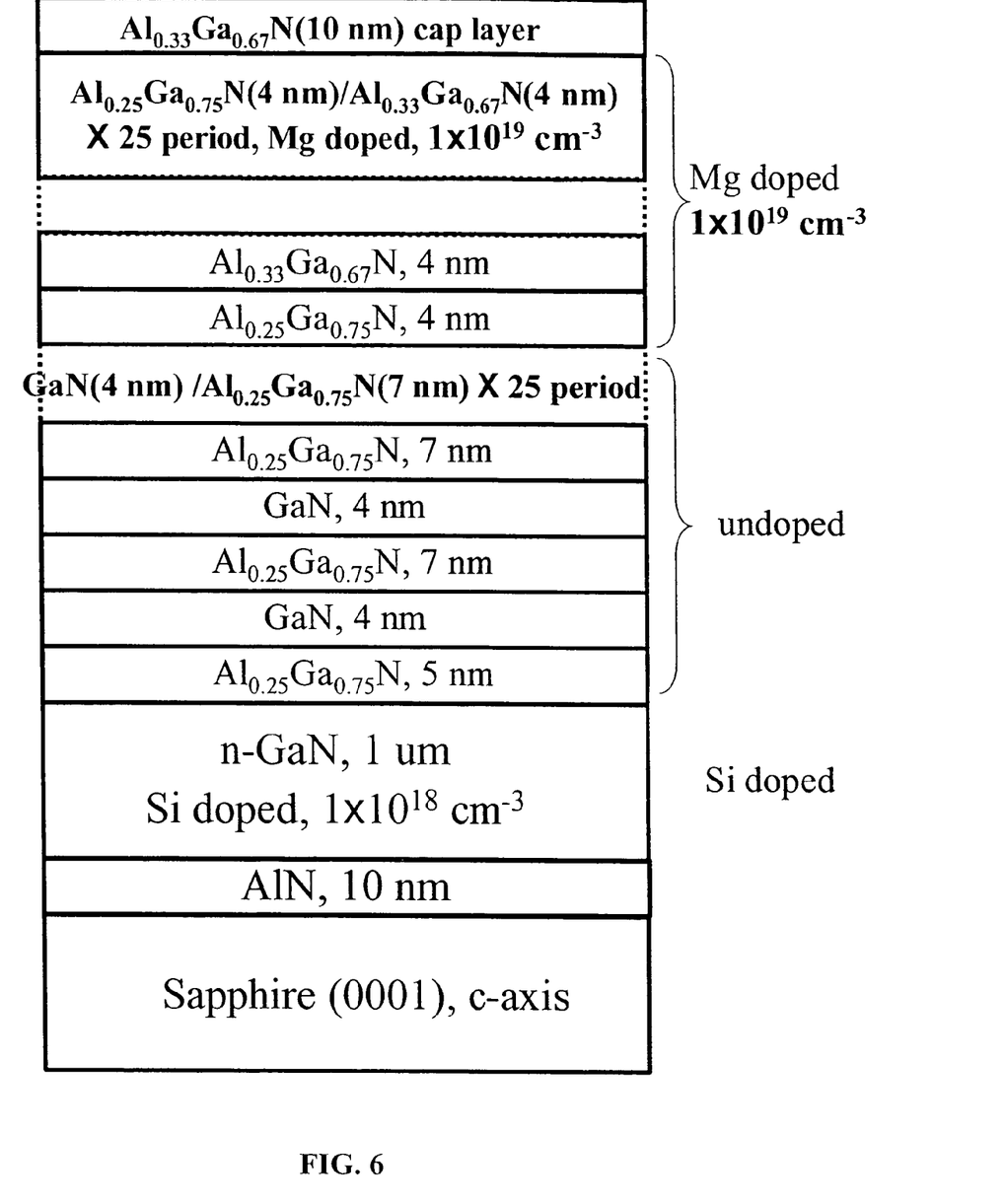
FIG. 6 is a schematic of a layered semiconductor structure according to the present invention, for use as a photodetector, with the semiconductor being formed by taking multiple alloyed III-nitride layers as the p type layer of the p-n junction.

Referring to FIG. 6, a schematic diagram of a layered semiconductor structure for a photodetector with p type layer of $Al_uGa_{1-u}N/Al_vGa_{1-v}N$ multiple layers, which is a so called superlattice, is shown. The superlattice is p type doped and plays the role of window layer. This device is for front side illumination where incident light firstly reaches the surface of the superlattice. Structure parameters for this device are not limited to the values shown in FIG. 6, which are set for a reference only. The device is designed to have the same device configuration as shown in FIG. 3 except that incident light is from front side. Transparent ohmic contact for the p type superlattice is required.

Figure 7:
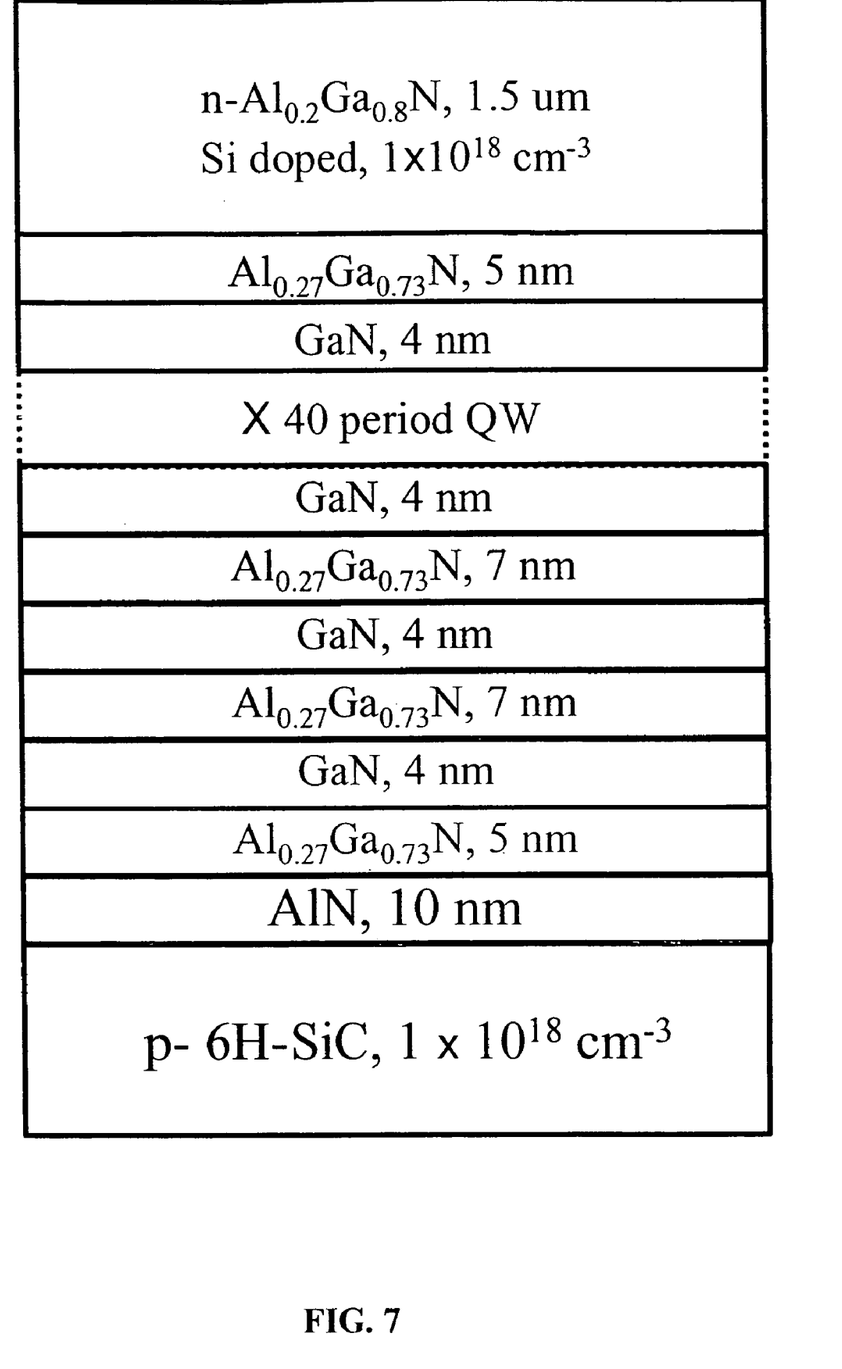
FIG. 7 is a schematic of a layered semiconductor structure according to the present invention, for use as a photodetector, with the semiconductor structure being formed by taking 6H—SiC material as the p type layer of the p-n junction, and also utilizing 6H—SiC as the substrate for the growth of III-nitride layers, with illustrative parameter values for the semiconductor being shown.
Figure 8:
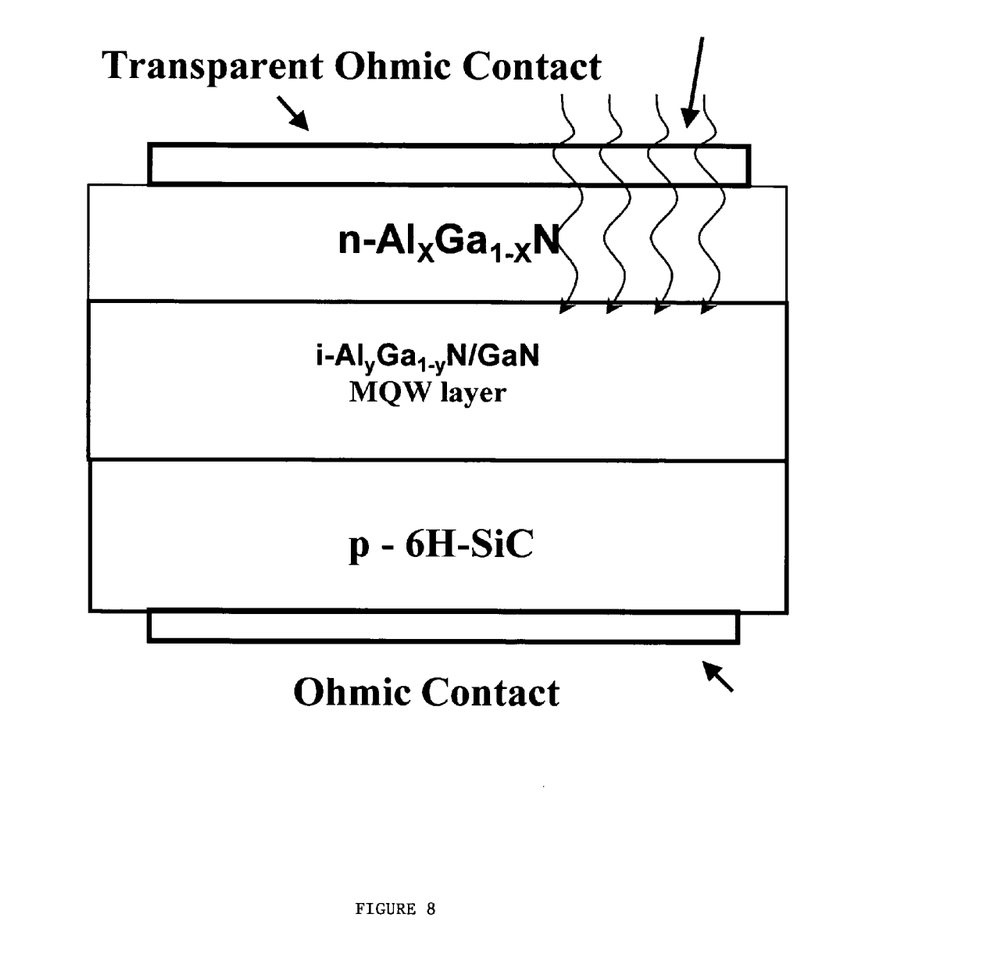
FIG. 8 is a schematic of a device according to the present invention, having a configuration as a front-illuminated photodetector, utilizing a layered semiconductor having the structure shown in FIG. 7, where 6H—SiC material is used as the substrate and p type layer of the p-n junction. The arrows indicate incident direction of light.

Referring to FIG. 7, a schematic diagram of layered semiconductor structure for a photodetector with p type layer of 6H—SiC material is shown. For this design, SiC is p type doped and used as substrate. The window layer is a $Al_wGa_{1-w}N$ layer which is n type doped. This device is for front side illumination where incident light firstly reaches the surface of the n type $Al_wGa_{1-w}N$ layer. Transparent ohmic contact for the n type $Al_wGa_{1-w}N$ layer is required. Structure parameters for this device are not limited to the values shown in FIG. 7, which are set for a reference only. The device configuration for this device is shown in FIG. 8.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention is not limited by the embodiments described above which are presented as examples only but can be modified in various ways within the scope of protection defined by the appended patent claims. All references cited herein are incorporated in their entirety by reference.

All references cited herein are incorporated in their entirety by reference.

What is claimed is:

1. A sequential resonant tunneling device for back-side illumination, comprising an alternating semiconductor layer structure as follows:

| | Material | Thickness (nm) | Dopant | Doping level |
|---|---|---|---|---|
| | c-plane (0001) sapphire substrate | Not limited | Not limited | Not limited |
| | AlN | 10 | un-doped | 0 |
| | $Al_{0.2}Ga_{0.8}N$ | 1000 | silicon | $1 \times 10^{18}$ cm$^{-3}$ |
| | $Al_{0.27}Ga_{0.73}N$ | 5 | undoped | 0 |
| | GaN | 4 | undoped | 0 |
| QW unit | $Al_{0.27}Ga_{0.73}N$ | 7 | undoped | 0 |
| | GaN | 4 | undoped | 0 |
| 30 QW units | . | . | . | . |
| | . | . | . | . |
| | . | . | . | . |
| | $Al_{0.27}Ga_{0.73}N$ | 7 | undoped | 0 |
| | GaN | 4 | undoped | 0 |
| | $Al_{0.27}Ga_{0.73}N$ | 5 | undoped | 0 |
| | GaN | 300 | magnesium | $1 \times 10^{18}$ cm$^{-3}$ |

2. The sequential resonant tunneling device according to claim 1, further comprising metal contacts on surfaces of n and p type semiconductors.

3. A sequential resonant tunneling device for front-side illumination, comprising a multi-layered semiconductor structure, as follows:

| | Material | Thickness (nm) | Dopant | Doping level |
|---|---|---|---|---|
| | c-plane (0001) sapphire substrate | Not limited | Not limited | Not limited |
| | AlN | 10 | Undoped | 0 |
| | GaN | 1000 | Silicon | $1 \times 10^{18}$ cm$^{-3}$ |
| | $Al_{0.25}Ga_{0.75}N$ | 5 | Undoped | 0 |
| | GaN | 4 | Undoped | 0 |
| QW unit A | $Al_{0.25}Ga_{0.75}N$ | 7 | Undoped | 0 |
| | GaN | 4 | Undoped | 0 |
| 30 periods QW unit A | . | . | . | . |
| | . | . | . | . |
| | . | . | . | . |
| | $Al_{0.27}Ga_{0.73}N$ | 7 | Undoped | 0 |
| | GaN | 4 | Undoped | 0 |
| QW unit B | $Al_{0.25}Ga_{0.75}N$ | 4 | magnesium | $1 \times 10^{18}$ cm$^{-3}$ |
| | $Al_{0.33}Ga_{0.67}N$ | 4 | magnesium | $1 \times 10^{18}$ cm$^{-3}$ |
| 25 periods QW unit B | . | . | . | . |
| | . | . | . | . |
| | . | . | . | . |
| | $Al_{0.25}Ga_{0.75}N$ | 4 | magnesium | $1 \times 10^{18}$ cm$^{-3}$ |
| | $Al_{0.33}Ga_{0.67}N$ | 4 | magnesium | $1 \times 10^{18}$ cm$^{-3}$ |
| | GaN | 10 | magnesium | $1 \times 10^{18}$ cm$^{-3}$. |

4. The sequential resonant tunneling device according to claim 3, further comprising metal contacts on surfaces of n and p type semiconductors.

5. A sequential resonant tunneling device for front-side illumination comprising a multilayered semiconductor structure as follows:

| | Material | Thickness (nm) | Dopant | Doping level |
|---|---|---|---|---|
| | 6H-SiC substrate | Not limited | p-type | $1 \times 10^{18}$ cm$^{-3}$ |
| | AlN | 10 | un-doped | 0 |
| | Al$_{0.27}$Ga$_{0.73}$N | 5 | Undoped | 0 |
| | GaN | 4 | Undoped | 0 |
| QW unit | Al$_{0.27}$Ga$_{0.73}$N | 7 | Undoped | 0 |
| | GaN | 4 | Undoped | 0 |

-continued

| | Material | Thickness (nm) | Dopant | Doping level |
|---|---|---|---|---|
| | . | . | . | . |
| 30 periods | . | . | . | . |
| QW units | . | . | . | . |
| | Al$_{0.27}$Ga$_{0.73}$N | 7 | Undoped | 0 |
| | GaN | 4 | Undoped | 0 |
| | Al$_{0.27}$Ga$_{0.73}$N | 5 | Undoped | 0 |
| | Al$_{0.2}$Ga$_{0.8}$N | 1000 | Silicon | $1 \times 10^{18}$ cm$^{-3}$ |
| | GaN | 10 | Silicon | $1 \times 10^{18}$ cm$^{-3}$. |

6. The sequential resonant tunneling device according to claim 5, further comprising metal contacts on surfaces of n and p type semiconductors.

* * * * *